United States Patent [19]

Liaw

[11] Patent Number: 5,998,279
[45] Date of Patent: Dec. 7, 1999

[54] MANUFACTURE OF A SHALLOW TRENCH ISOLATION DEVICE BY EXPOSING NEGATIVE PHOTORESIST TO INCREASED EXPOSURE ENERGY AND CHEMICAL MECHANICAL PLANARIZATION

[75] Inventor: Ing-Ruey Liaw, Hsinchu, Taiwan

[73] Assignee: Vanguard International Semiconductor Corporation, Hsin-Chu, Taiwan

[21] Appl. No.: 09/200,588

[22] Filed: Nov. 27, 1998

[51] Int. Cl.$^6$ .................................................. H01L 21/762
[52] U.S. Cl. ............................................. 438/424; 438/427
[58] Field of Search ................................... 438/424, 427, 438/700, FOR 227, FOR 435

[56] References Cited

U.S. PATENT DOCUMENTS

| | | |
|---|---|---|
| 5,350,486 | 9/1994 | Huang . |
| 5,494,857 | 2/1996 | Cooperman et al. . |
| 5,641,704 | 6/1997 | Paoli et al. . |
| 5,691,215 | 11/1997 | Dai et al. . |
| 5,728,618 | 3/1998 | Tseng . |

*Primary Examiner*—George Fourson
*Attorney, Agent, or Firm*—George O. Saile; Stephen B. Ackerman; Graham S. Jones, II

[57] ABSTRACT

This is a method of manufacture of a shallow trench isolation semiconductor device with STI trenches where an active area mask is provided for exposure of an active area during manufacture of the device comprises several following steps. The STI trenches are filled by coating the device with a blanket coating of silicon oxide. Coat the device with negative resist. Next, expose the negative resist layer with the active area mask for the device providing windows through the negative photoresist layer with an level of exposure energy provided to broaden the dimensions of exposure substantially laterally of the active area mask. Then, etch back the silicon oxide layer to a thin layer below the windows through the negative photoresist layer. Strip the resist. Finally, perform chemical mechanical planarization to remove excess silicon oxide from the surface.

7 Claims, 4 Drawing Sheets

MANUFACTURE OF A SHALLOW TRENCH ISOLATION DEVICE BY EXPOSING NEGATIVE PHOTORESIST TO INCREASED EXPOSURE ENERGY AND CHEMICAL MECHANICAL PLANARIZATION

BACKGROUND OF THE INVENTION

1. Field of the Invention

This invention relates to the process of manufacture of semiconductor devices which employ Shallow Trench Isolation (STI) and more particularly to use of negative photoresist and CMP for shallow trench isolation.

2. Description of Related Art

U.S. Pat. No. 5,350,486 of Huang for a "Semiconductor Planarization Process" shows a method of planarization using a photoresist (PR) layer to etch oxide from an oxide layer located over active areas. The method includes the steps of selectively etching portions of a glass structure that overlies portions of the oxide layer that have higher elevations than other portions of the oxide layer, and then etching the glass layer overall. The etching step includes forming a photoresist layer over the glass layer. A positive or negative photoresist layer is formed by exposing selected areas of the photoresist layer in areas over those portions of the oxide layer that have higher elevations than other portions of the oxide layer. As a result, the exposed areas of the photoresist layer are removed to form a set of windows therethrough thereby converting the photoresist layer into a photoresist layer. Then the glass layer is etched where it is exposed through those through the windows in photoresist layer. The master mask used in patterning the photoresist layer can be the same mask, or its negative, that is used in forming the metallization layer over which the oxide and glass layers have been formed. If the negative of the master mask is used then a positive photoresist layer is used. If the same master mask is used, then a reverse tone photoresist layer is used.

U.S. Pat. No. 5,691,215 of Dai et al. for "Method for Fabricating a Sub-Half Micron Device with Insulator Filled Shallow Trenches Planarized Via Use of Negative Photoresist and De-Focus Exposure" shows a process featuring smoothing the topography that exists after the insulator filling of narrow and shallow trenches, by creating photoresist plugs, only in the depressed topography regions. This is accomplished using a negative photoresist layer, a de-focus exposure, and the identical mask used to create the shallow trench pattern in a positive photoresist layer. A RIE (Reactive Ion Etching) procedure, with a 1:1 etching selectivity, is used to complete the planarization process. However, this patent does not show the invention's next CMP step.

U.S. Pat. No. 5,641,704 of Paoli et al. for "Method of Isolating Active Areas of a Semiconductor Substrate by Shallow Trenches and Narrow Trenches" teaches an isolation planarization using a negative mask before an etch back and CMP. However, Paloi teaches CMP but does not teach the Negative photoresist (PR) of the invention. See col. 5, lines 41–44.

U.S. Pat. No. 5,494,857 of Cooperman et al. for "Chemical Mechanical Planarization in Semiconductor Substrates" teaches an isolation planarization using a negative mask before an etch back and Chemical Mechanical Planarization (CMP).

SUMMARY OF THE INVENTION

Although Cooperman et al. does teach CMP it does not teach the use of a negative photoresist (PR) in accordance with the present invention. See col. 4, lines 12–15.

The Huang patent does not suggest a CMP step.

In the prior art it is necessary to expose the wafer edge using a reverse-tone mask, to increase CMP polishing rate at the edge of the wafers (by dividing up the HDP oxide at the edge of the wafers. If it did not expose the edge of the wafers, it would be much slower than at the very dense cell area, or even at somewhat dense peripheral/logic area. Therefore, Chemical Mechanical Planarization (CMP) wafer uniformity is poor-silicon oxide thickness control is critical for STI and if not controlled problem as can include device defects (e.g. additional device formed at the corners or patterning polysilicon due to step height (too much silicon oxide in trench.))

One can expose the edge of the wafer, but this adds to cost and also leads to peeling of silicon nitride at the edge of the wafer.

Most of the Shallow Trench Isolation used in the integrated circuits require the use of one additional mask with reverse tone and sizing to a small opening. With this mask, large active area covered with re-filled silicon oxide can be etched back and make larger thicker re-filled silicon oxide area which is hard to be polished during CMP become a small island or just a tip which is easier to be polished back and prevent the dishing effect at large isolation area. But with this reverse tone mask can not expose the area which is close to wafer edge and alignment mark.

In accordance with this invention a negative photoresist (PR) layer is used to etch back silicon oxide and then a CMP planarization step follows.

The manufacturing method of this invention comprise a method provides a shallow trench isolation semiconductor device with STI trenches using an active area mask to expose an active area during manufacture of the device. The STI trenches are filled by coating the device with a blanket coating of silicon oxide. Coat the device with negative resist. Expose the negative resist layer with the active area mask for the device providing windows through the negative photoresist layer with an level of exposure energy provided to broaden the dimensions of exposure substantially laterally of the active area mask. Etch back the silicon oxide layer to a thin layer below the windows through the negative photoresist layer. Strip the resist. Perform chemical mechanical planarization to remove excess silicon oxide from the surface.

The silicon oxide layer initially has a thickness of from about 4,000 Å to about 6,000 Å, etched portions of the silicon oxide layer has a thickness of from about 4,000 Å to about 6,000 Å, and the increased level of exposure energy broadens the width of the negative resist mask by at least 30% beyond the dimensions of the active area mask. Strip silicon nitride from the device.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
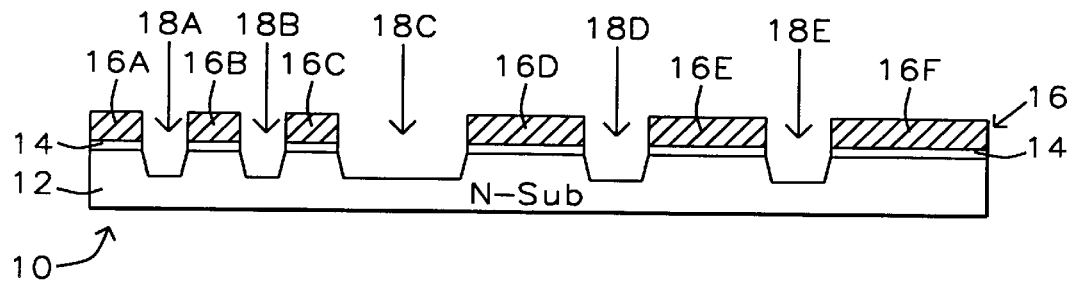
FIG. 1 shows an integrated circuit device with STI trenches adapted for manufacture of a device by a method in accordance with this invention.

FIG. 1 shows an integrated circuit device 10 adapted for manufacture of a device by a method in accordance with this invention. Device 10 is shown after a P-doped silicon semiconductor substrate 12 has been covered with a gate oxide layer 14 and a doped polysilicon metallization layer 16 which is patterned into conductors and gate electrodes.

A series of STI trenches 18A–18E have been formed by etching the trenches in the top surface of the device 10. The STI trenches 18A–18E extend down through the polysilicon layer 16 to form the standard STI trenches by a conventional process as will be well understood by those skilled in the art. There are thus produced polysilicon buttes 16A–16C and polysilicon mesas 16A–16C which are located between the trenches 18A–18E, the mesas being wider than the buttes.

Step 1

Figure 2:
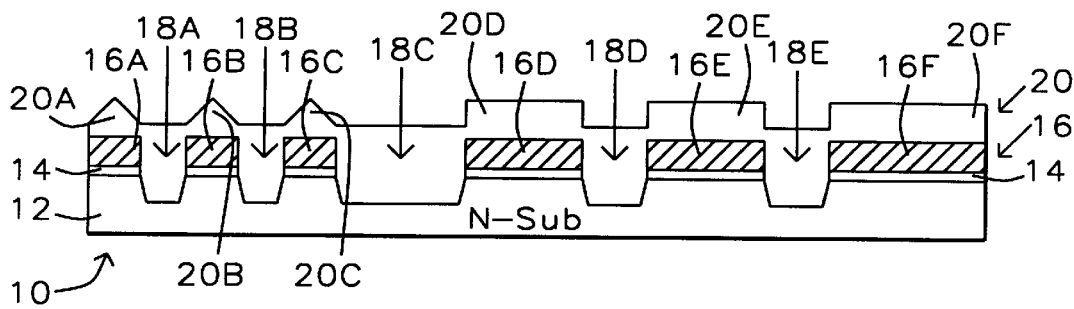
FIG. 2 shows the device of FIG. 1 after refilling the STI trenches with a blanket layer of re-filled silicon oxide.

FIG. 2 shows the device 10 of FIG. 1 after refilling the trenches 18A–18E with a blanket layer 20 of re-filled silicon oxide (with to a thickness of from about 4,000 Å to about 6,000 Å) which produces sharp peaks 20–20C over narrow polysilicon buttes 16A–16C. There are also refilled silicon oxide mesas 20D–20F formed over the wider polysilicon mesas 16D–16F. That is to say that mesas 16D–16F are substantially wider than the buttes 16A–16C.

Step 2

Figure 3:
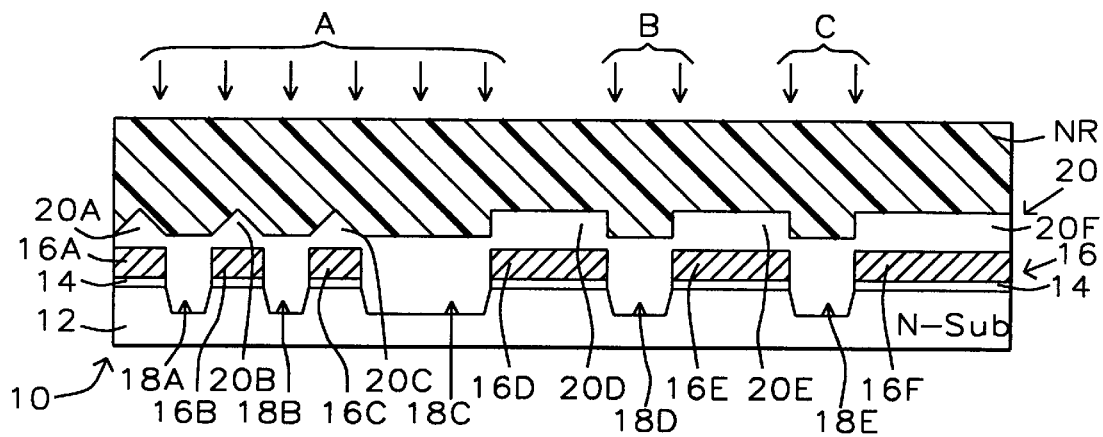
FIG. 3 shows the device of FIG. 2 after coating a blanket negative photoresist layer over the blanket layer of re-filled silicon oxide being exposed to beams projected through the active area mask for the device being manufactured.

FIG. 3 shows the device 10 of FIG. 2 after coating a blanket negative photoresist layer NR over the blanket layer of re-filled silicon oxide 20. The blanket negative photoresist layer NR is exposed over the active area with an active area mask (not shown) with light in beam A over trenches 18A, 18B and 18C and over buttes 16A, 16B and 16C, beam B over trench 18D and beam C over over trench 18E.

Also, the exposure energy of beams A, B and C is increased by a sufficient amount of energy to prevent exposure of the isolation area and also to cover the misalignment tolerance.

A standard of comparison in measuring this energy increase is that one must cover critical dimension (CD) variation and misalignment. If a single mask is difficult to achieve, sizing of the original mask is the second choice.

The usual exposure energy is from about 10 nj to 30 nj. The increase of exposure energy is measured as being 50% greater than the usual exposure energy.

The increased exposure energy broadens the width of the negative resist mask by at least 30% beyond the width of said active area mask.

Step 3

Figure 4:
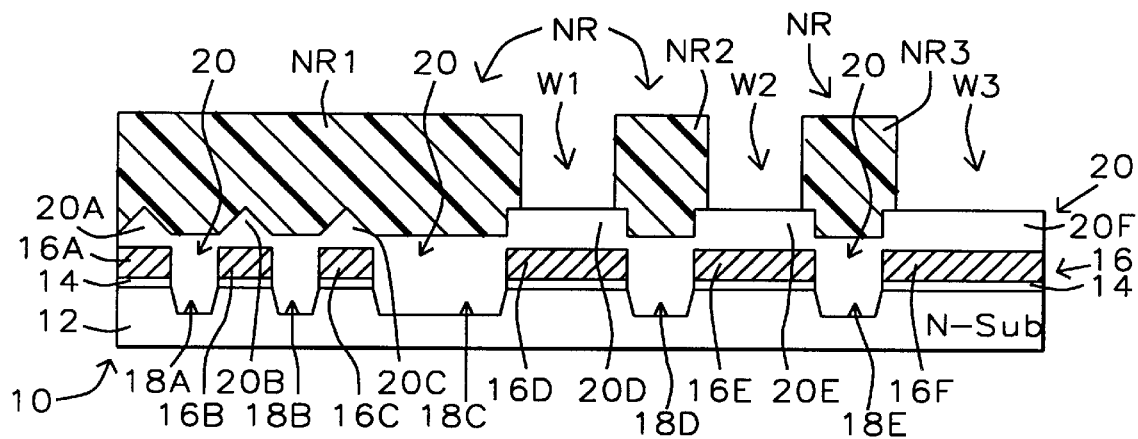
FIG. 4 shows the device of FIG. 3 after developing the negative photoresist layer into a negative photoresist mask

FIG. 4 shows the device 10 of FIG. 3 after developing the photoresist layer NR, the larger and thicker re-filled silicon oxide area on the active area has been exposed including the edge of the wafer which includes the substrate 12 and the alignment mark area, as well as will be well understood by those skilled in the art.

Thus is to say that the active area mask exposure with beams A, B and C has produced windows W1, W2 and W3 over the mesas 20D, 20E and 20F which are narrower than the mesas 20D, 20E and 20F. The mask NR is formed into three sections, starting with negative photoresist mask NR1 over the sharp peaks 20–20C above buttes 16A, 16B, and 16C as well as the trenches 18A, 18B and 18C as well as a portion of the mesa 20D at the left end. Negative photoresist mask NR2 covers the trench 18D as well as a portion of the mesa 20D at the right end and a portion of the mesa 20E at the left end thereof. Negative photoresist mask NR3 covers the trench 18E as well as a portion of the mesa 20E at the right end and a portion of the mesa 20F at the left end thereof.

Step 4

Figure 5:
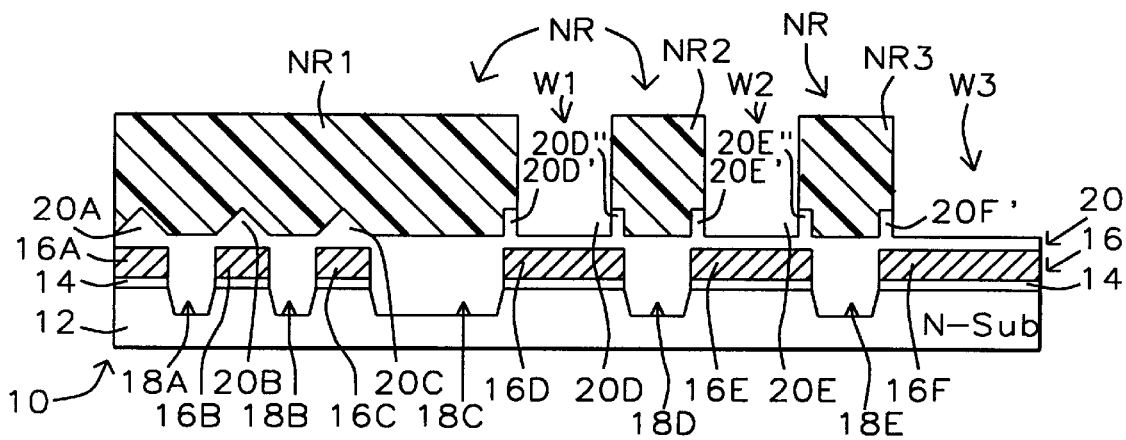
FIG. 5 shows the device of FIG. 4 after etching back the thicker portion of the blanket re-filled silicon oxide layer through the negative photoresist mask with the margins of the silicon oxide re-fill remaining after etching.

FIG. 5 shows the device 10 of FIG. 4 after etching back the thicker portion of the blanket re-filled silicon oxide layer 20 through the windows W1, W2 and W3 of the negative photoresist mask of FIG. 4. The etching back process also includes the non-exposed area close to the wafer edge and alignment mark. Where exposed through the windows W1, W2 and W3, the silicon oxide layer 20 is reduced to a thickness of from about 0 Å to about 1,000 Å. The result is that the mesas 20D, 20E and 20E have been removed in the centers, but the margins 20D' and 20D" have been left in the case of mesa 20D, the margins 20E' and 20E" have been left in the case of mesa 20E, and the margin 20F' has been left in the case of mesa 20F and the sharp peaks 20–20C remain as well since they were protected by mask section NR1.

Step 5

Figure 6:
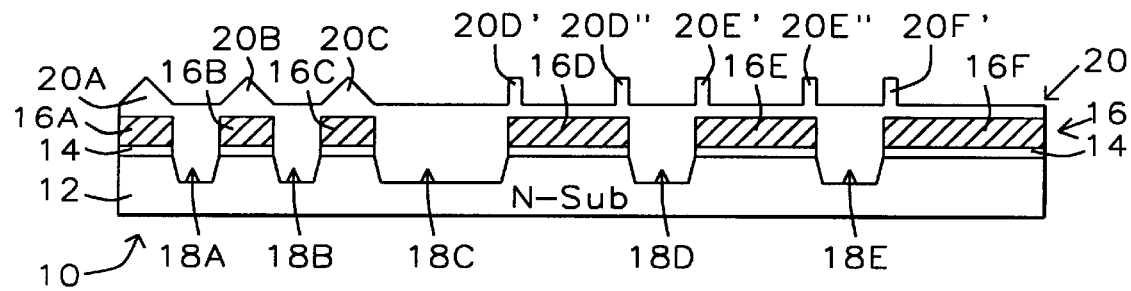
FIG. 6 shows the device of FIG. 5 after stripping the photoresist NR from the device with the margins of the raised portions of the silicon oxide re-fill extending above the surface of the device.

FIG. 6 shows the device 10 of FIG. 5 after stripping the photoresist NR from the device 10 with the margins 20D' and 20D" have been left in the case of mesa 20D. The margins 20E' and 20E" have been left in the case of mesa 20E, and the margin 20F' has been left in the case of mesa 20F and the sharp peaks 20–20C remain as well since they were protected by mask section NR1.

Step 6

Figure 7:
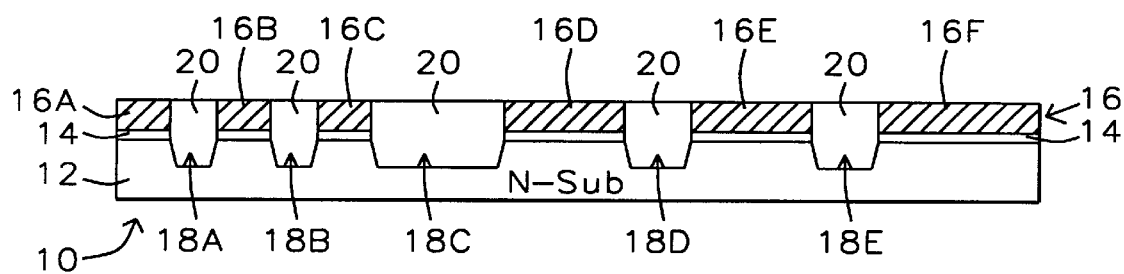
FIG. 7 shows the device of FIG. 6 after a step of Chemical Mechanical Planarization (CMP) polishing back the blanket re-filled silicon oxide layer and stripping the silicon nitride ($Si_3N_4$) thereby forming a completed Shallow Trench Isolation (STI) structure.

FIG. 7 shows the device 10 of FIG. 6 after a step of Chemical Mechanical Planarization (CMP) polishing back the blanket re-filled silicon oxide layer 20 and stripping the silicon nitride ($Si_3N_4$) thereby forming a completed Shallow Trench Isolation (STI) structure. The sharp peaks 20–20C over narrow polysilicon buttes 16A–16C and the margins 20D', 20D", 20E' 20E" and 20F' have been removed from the surface of layer 20 which has now been planarized to expose the surfaces of narrow polysilicon buttes 16A–16C and wide polysilicon mesas 16D–16F.

Figure 8:
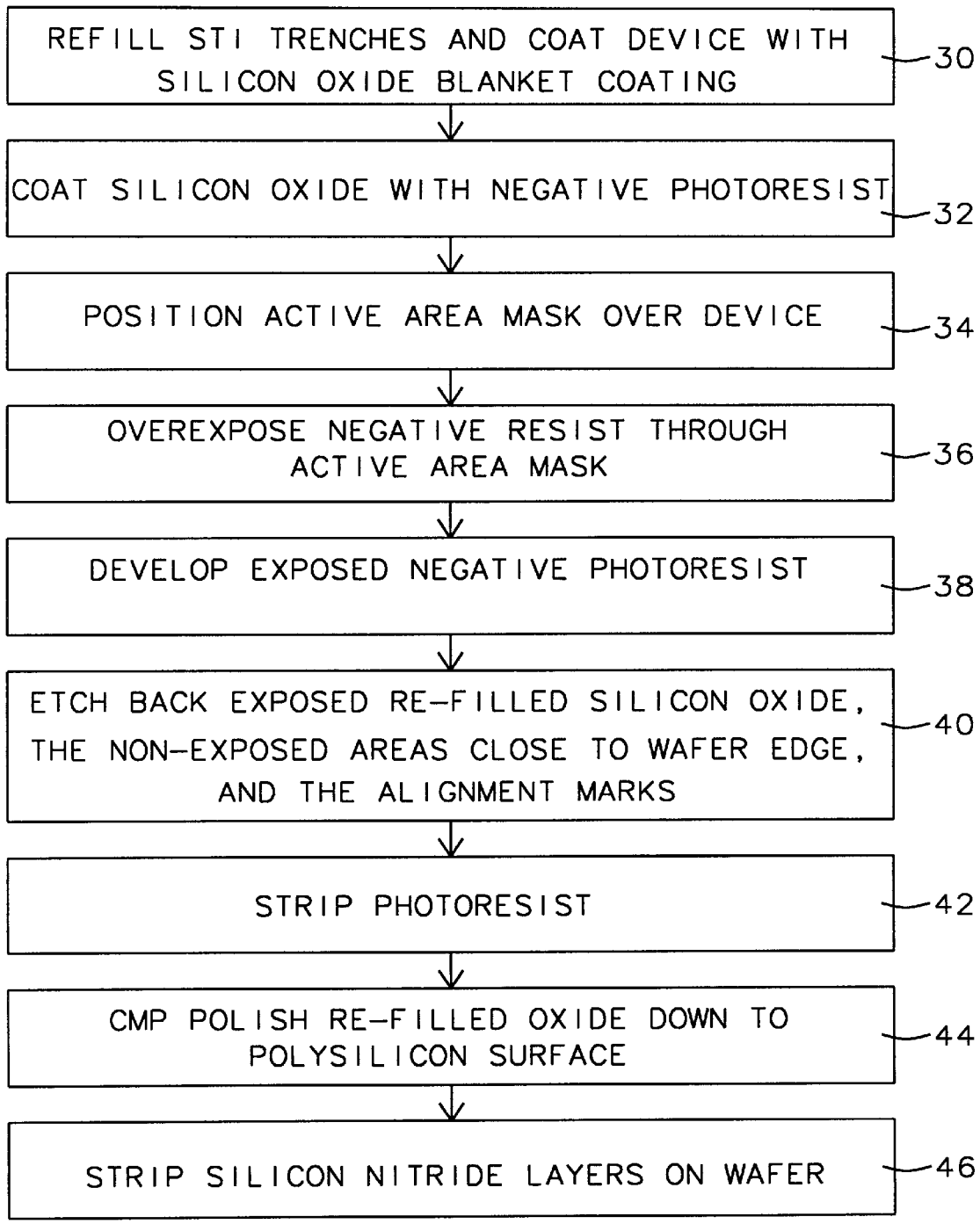
FIG. 8 shows a flow chart of process of this invention.

FIG. 8 shows a flow chart of process of this invention which performs the following steps.

In step 30 refill STI trenches 18A–18E and coat device 10 with blanket coating of silicon oxide layer 20.

In step 32 coat silicon oxide layer 20 with negative photoresist NR.

In step 34 position active area mask over device 10.

In step 36 overexpose negative resist NR through active area mask.

In step 38 develop exposed negative photoresist NR.

In step 40 etch back exposed re-filled silicon oxide layer 20, the non-exposed areas close to wafer edge, and the alignment marks.

In step 42 strip photoresist NR.

In step 44 CMP polish re-filled silicon oxide 20 down to polysilicon surface 16.

In step 46 strip silicon nitride layers on wafer 12.

Summary

An important advantage of this invention is that it is possible to save one a mask and to reduce the dishing effect while reducing the thicker re-filled silicon oxide area close to the edge of the wafer and to the alignment marks.

Thus, there is no need for an active area reverse tone mask.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a shallow trench isolation semiconductor device wherein STI trenches where an active area mask is provided for exposure of an active area during manufacture of said device comprising the following steps:

a) filling said STI trenches by coating said device with a blanket coating of silicon oxide, b) coating said device with negative resist, c) exposing said negative resist layer with said active area mask for said device providing windows through said negative photoresist layer with an level of exposure energy provided to broaden the dimensions of exposure substantially laterally of said active area mask, d) etching back said silicon oxide layer to a thin layer below said windows through said negative photoresist layer, e) stripping said resist, and f) chemical mechanical planarization to remove excess silicon oxide from the surface.

2. A method of manufacture in accordance with claim 1 wherein:

said silicon oxide layer initially has a thickness of from about 4,000 Å to about 6,000 Å, and etched portions of said silicon oxide layer has a thickness of from about 4,000 Å to about 6,000 Å.

3. A method of manufacture in accordance with claim 1 wherein:

said increased level of exposure energy broadens the width of the negative resist mask by at least 30% beyond the width of said active area mask.

4. A method of manufacture in accordance with claim 1 wherein:

said silicon oxide layer initially has a thickness of from about 4,000 Å to about 6,000 Å, and etched portions of said silicon oxide layer has a thickness of from about 4,000 Å to about 6,000 Å, and said increased level of exposure energy broadens the width of the negative resist mask by at least 30% beyond the dimensions of said active area mask.

5. A method of manufacture in accordance with claim 1 wherein:

said silicon oxide layer initially has a thickness of from about 4,000 Å to about 6,000 Å, and etched portions of said silicon oxide layer has a thickness of from about 4,000 Å to about 6,000 Å, and strip silicon nitride from said device.

6. A method of manufacture in accordance with claim 1 wherein:

said increased level of exposure energy broadens the width of the negative resist mask by at least 50% beyond the width of said active area mask, and strip silicon nitride from said device.

7. A method of manufacture in accordance with claim 1 wherein:

said silicon oxide layer initially has a thickness of from about 4,000 Å to about 6,000 Å, and etched portions of said silicon oxide layer has a thickness of from about 4,000 Å to about 6,000 Å, and said increased level of exposure energy broadens the width of the negative resist mask by at least 30% beyond the dimensions of said active area mask, and strip silicon nitride from said device.

\* \* \* \* \*